United States Patent [19]

Sugimoto

[11] Patent Number: 5,132,618
[45] Date of Patent: Jul. 21, 1992

[54] MAGNETIC RESONANCE IMAGING SYSTEM INCLUDING ACTIVE SHIELD GRADIENT COILS FOR MAGNETICALLY CANCELING LEAKAGE GRADIENT FIELD

[75] Inventor: Hiroshi Sugimoto, Tochigi, Japan

[73] Assignee: Kabushiki Kaisha Toshiba, Kanagawa, Japan

[21] Appl. No.: 624,553

[22] Filed: Dec. 10, 1990

[30] Foreign Application Priority Data

Dec. 11, 1989 [JP] Japan .................... 1-318942

[51] Int. Cl.$^5$ .......................... G01R 33/20
[52] U.S. Cl. .................... 324/318; 335/300; 335/301
[58] Field of Search ............... 324/322, 318, 319, 320, 324/315; 335/300, 301, 304; 336/84 R, 84 C

[56] References Cited

U.S. PATENT DOCUMENTS

| | | | |
|---|---|---|---|
| 4,651,117 | 3/1987 | Kawaguchi et al. | 335/301 |
| 4,733,189 | 4/1988 | Punchard et al. | 324/318 |
| 4,737,716 | 4/1988 | Roemer et al. | 324/318 |
| 4,771,256 | 9/1988 | Laskaris et al. | 324/320 |
| 4,783,628 | 11/1988 | Huson | 324/320 |
| 4,794,338 | 12/1988 | Roemer et al. | 324/318 |
| 4,876,510 | 10/1989 | Siebold et al. | 324/318 |
| 4,924,185 | 5/1990 | Matsutani | 324/319 |
| 4,990,878 | 2/1991 | Takechi et al. | 324/318 |

FOREIGN PATENT DOCUMENTS

| | | | |
|---|---|---|---|
| 293723 | 5/1988 | European Pat. Off. | 324/322 |
| 317853 | 11/1988 | European Pat. Off. | 324/322 |
| 2199147 | 6/1988 | United Kingdom | 324/318 |
| 2229820 | 10/1990 | United Kingdom | 324/322 |

OTHER PUBLICATIONS

P. Manfield & B. Champman, Jour. of Phys. E. Sc. Instru., vol. 19, 1986, "Active Magnetic Screening of Coils for Static and Time-Dependent Magnetic Field Generation in NMR Imaging", pp. 540-545.

R. Turner, et al., Jour. of Magnetic Resonance, vol. 80, No. 2, Nov. 1988, entitled "Snap-Shot Magnetic Resonance Imaging at 0.1 T Using Double-Screened Gradients" pp. 248-258.

B. Champman & P. Manfield, Jour. of Physics D. App. Phys., vol. 19, 1986, entitled "Double Active Magnetic Screening of Coils in NMR", pp. 129-131.

Primary Examiner—Michael J. Tokar
Assistant Examiner—Raymond Y. Mah
Attorney, Agent, or Firm—Limbach & Limbach

[57] ABSTRACT

In a magnetic resonance imaging apparatus, there are provided: an MR (magnetic resonance) imaging unit having an imaging hole at a substantially central portion thereof, into which an object under medical examination is inserted; a superconducting coil unit stored within an outer vessel which is positioned around the imaging hole, and including a superconducting coil assembly for uniformly producing a static magnetic field to be applied to the object, and at least one heat shield tube or thermally shielding the superconducting coil assembly stored therein; a gradient field coil assembly provided between the outer vessel and imaging hole; for producing a gradient magnetic field so as to be superimposed with the static magnetic field. Further, it employs a active shield gradient coil assembly for producing a gradient shield field, and disposed within the outer vessel in such a manner that the active shield gradient coil assembly is thermally coupled to the heat shield tube and also magnetically coupled with a leakage field leaked from the gradient magnetic field of the gradient field coil assembly, whereby the leakage field is magnetically canceled by the gradient shield field and substantially no eddy current is produced in the heat shield tube.

6 Claims, 7 Drawing Sheets

MAGNETIC RESONANCE IMAGING SYSTEM INCLUDING ACTIVE SHIELD GRADIENT COILS FOR MAGNETICALLY CANCELING LEAKAGE GRADIENT FIELD

BACKGROUND OF THE INVENTION

1. Field of the Invention

The present invention generally relates to a magnetic resonance imaging system employing active shield gradient coils for magnetically canceling a leakage gradient field. More specifically, the present invention is directed to an active shield gradient coil system to effectively mitigating eddy current loss occurring in heat-shield members for maintaining a superconducting coil assembly at very low temperatures.

2. Description of the Related Art

Figure 1:
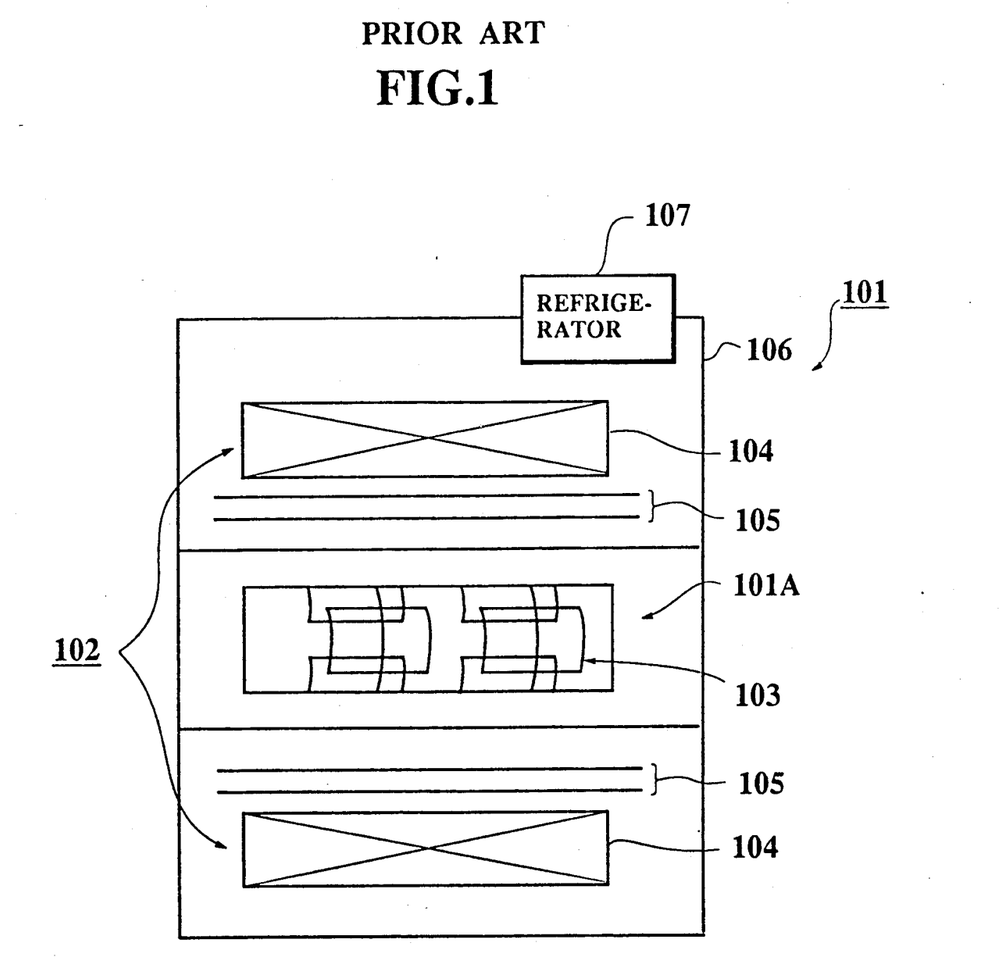
FIGS. 1 and 2 are illustrations of two typical conventional MR imaging systems.

In FIG. 1, there is shown one of the conventional magnetic resonance (hereinafter referred to as "MR") imaging apparatuses. This conventional MR imaging apparatus comprises a gantry 101 having an imaging hole 101A at a center thereof. In this gantry 101, there are provided a superconducting magnet 102 around the peripheral portion thereof for producing a uniform static magnetic field and a gradient field coil 103 for producing a gradient magnetic field to be superimposed with the static magnetic field within the magnet bore 101A. The superconducting magnet 102 is so constructed that both a toroidal superconducting coil 104 stored within a liquid helium bath (not shown in detail), and a heat shield tube 105 for thermally shielding the superconducting coil 104 are stored in an outer vessel 106, the cross-sectional shape thereof being toroidal. A refrigerator 107 is employed so as to cool the superconducting magnet 5 by utilizing a vapored helium gas, whereby a total amount of vapored helium within the helium bath can be suppressed.

During MR imaging operation, an object under medical examination, e.g., a patient (not shown) is inserted into this magnet bore 101A, the static magnetic field produced from the superconducting magnet 102 is uniformly applied particularly to a specific portion (a portion to be imaged) of the patient, and also RF magnetic fields are applied thereto in a direction perpendicular to the application direction of the static magnetic field. Furthermore, since the preselected gradient magnetic fields produced from the above-described gradient field coil 103 are superimposed on the static magnetic field, the MR phenomenon may occur only at the specific slice portion of the object under medical examination and an MR signal (e.g., FID signal and spin echo signal) generated from the specific slice portion is acquired after the application of the RF fields has been accomplished. The acquired MR signal is further processed in the image data processor (not shown) by way of, e.g., Fourier transform, whereby tomographic images may be reconstructed and desirable tomographic images may be displayed on a monitor (not shown).

When the gradient magnetic fields are produced from the gradient magnetic coil 103, pulsatory leakage fields may happen to occur therefrom so that eddy currents will be produced on the heat shield tube 105 for maintaining the superconducting magnet 104 at a very low temperature, and furthermore, another pulsatory magnetic field is newly generated by these eddy currents, which will in turn be superimposed with the existing gradient fields. As a result, the resultant gradient magnetic fields cannot constitute a predesigned gradient magnetic field, i.e., magnetic flux and distribution shapes. Accordingly, artifact may be induced in the tomographic images and the signal level of the MR signal is lowered, resulting in deterioration of image quality.

To solve the above-described problems caused by the leakage field from the gradient field, a so-called "active shield method" has been proposed.

For instance, see U.S Pat. No. 4,737,716 issued to Roemer et al. on Apr. 12, 1988; U.S. Pat. No. 4,733,189 issued to Punchard et al. on Mar. 22, 1988; and U.S. Pat. No. 4,794,338 on Dec. 27, 1988.

Figure 2:
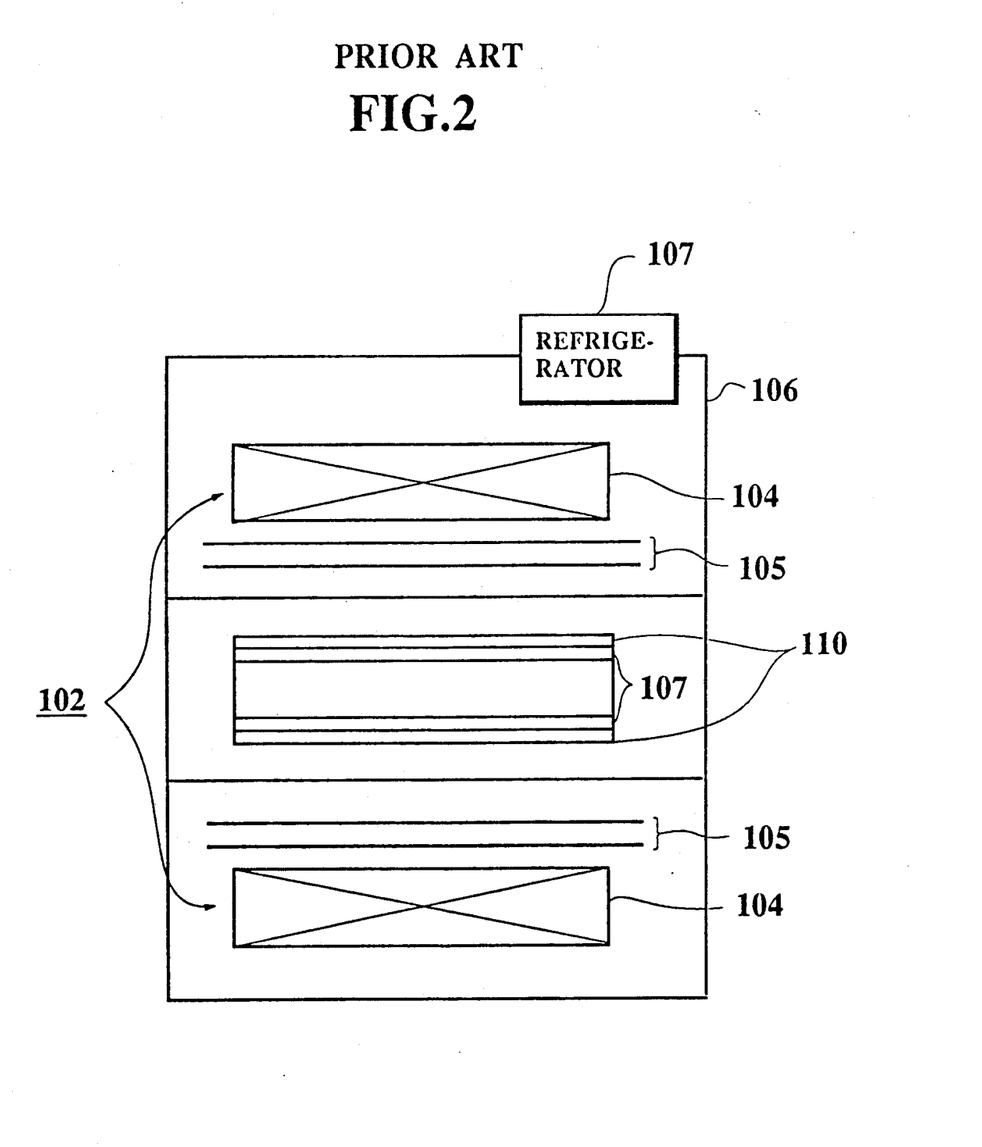

A basic idea of such a conventional active shield method will now be summarized with reference to an illustration of FIG. 2. It should be noted that the same reference numerals employed in FIG. 1 are employed to denote the same or similar components shown in FIG. 2.

As shown in FIG. 2, an active shield gradient coil 110 is employed between the active shield gradient coil 107 and superconducting magnet 102 in order to cancel the above-described leakage field by superimposing a gradient shield field generated by this active shield gradient coil 110 onto the leakage field. A field direction of this gradient shield field is opposite to that of the leakage field. Accordingly, employment of the active shield gradient coil 110 may prevent the eddy current from being produced in the heat shield tube 105. In general, both the gradient field coil 107 and active shield gradient coil 110 are mounted within a bore (a typical diameter is designed for approximately 1,000 mm) formed at a center portion of the outer vessel 106, and both of these coils 107 and 110 are integrally fabricated.

However, there is another problem in the above-described active shield method. That is, since an interval between the gradient field coil 107 and active shield gradient coil 110 is rather short, or the gradient field coil 107 is positioned in close proximity to the active shield gradient coil 110, large energizing current must be supplied to the active shield gradient coil 110 so as to sufficiently cancel a gradient leakage field leaked from the gradient magnetic field of the active shield gradient coil 107. Therefore, total power consumption is increased and large heat dissipation will occur from the active shield gradient coil 110.

In addition, to reduce such large heat from the active shield gradient coil 110, another cooling means different from the above-described refrigerator 107 is additionally required.

As previously described, since two coil energizing currents having mutually opposite flow directions must be supplied to both coils 107 and 110 and thus a difference between the field strengths of these coils 107 and 110 becomes a strength of the gradient field actually applied to the patient (not shown), the following problem may occur. That is, the shorter an interval between two coils 107 and 110, the smaller a difference between the field strengths produced by these coils become, so that the strength of the actually applied gradient field becomes small in inverse proportion to current valves of these coils 107 and 110 and the desirable gradient field cannot be effectively produced.

To separate these coils 107 and 110 from each other as long as possible within this bore, the diameter of the bore may be enlarged. However, this causes such a drawback that the entire dimension of the superconducting magnet 102 becomes large, and therefore a large install space as well as higher cost are necessarily required. In a particular case, the existing examination room for the MR imaging purpose cannot be used and a new examination room with a higher ceiling height must be prepared for installing such large-sized MR imaging apparatus. Alternatively, the diameter of the gradient magnetic coil 107 may be made small. However, this cause another difficulty that a patient must be inserted into such a narrower space, which will in turn induce claustrophobia. Accordingly, the above-described solutions do not have yet been realized in the practical MR imaging field.

Furthermore, if the above-described active shield gradient coil is tried to be entered into the bore of the first-described conventional MR imaging apparatus shown in FIG. 1, the present diameter of this bore must be expanded and therefore huge modification cost and cumbersome workloads will be necessarily required.

In accordance with another practical solution, slits may be formed in the heat shield tube 105 so as to suppress the eddy current loss. However, the leakage field generated by the gradient field coil 107 may reach the above-described liquid helium tub positioned inside the heat shield tube 105 and then causes another eddy current loss in this liquid helium tube. As a consequence, a total amount of vapored liquid helium is increased due to this eddy current heat dissipation.

SUMMARY OF THE INVENTION

The present invention has been made in an attempt to solve the above-described drawbacks of the conventional MR imaging systems, and therefore has an object to provide an MR imaging system including an active shield gradient coil capable of being energized under lower power consumption and also capable of effectively reducing eddy current effects.

Another object of the present invention is to provide an MR imaging system capable of reducing total heat dissipation of heat shield members for a superconducting coil system and capable of improving qualities of tomographic images.

A magnetic resonance imaging system, according to the present invention, comprises:

an MR (magnetic resonance) imaging unit (600) having an imaging hole (3) at a substantially central portion thereof, into which an object (P) under medical examination is inserted;

a superconducting coil unit (15) stored within an outer vessel (60) which is positioned around the imaging hole (3), and including superconducting coil means (17) for uniformly producing a static magnetic field to be applied to the object (P), and at least one heat shield member (18) for thermally shielding the superconducting coil means (17) enclosed therein;

gradient field coil means (50) provided between the outer vessel (60) and imaging hole (3), for producing a gradient magnetic field so as to be superimposed with the static magnetic field, and, active shield gradient coil means (52) for producing a gradient shield field ($H_{GS}$), and disposed within the outer vessel (60) in such a manner that the active shield gradient coil means (52) is thermally coupled to the heat shield member (18) and also magnetically coupled with a leakage field ($H_{GL}$) leaked from the gradient magnetic field the gradient field coil means (50), whereby the leakage field ) ($H_{GL}$) is magnetically canceled by the gradient shield field ($H_{GS}$) and substantially no eddy current is produced in the heat shield tube (18).

BRIEF DESCRIPTION OF THE DRAWINGS

For a better understanding of the above-described objects and features of the present invention, reference is made to the following descriptions in conjunction with the accompanying drawings, in which.

DETAILED DESCRIPTION OF THE PREFERRED EMBODIMENTS

BASIC IDEA

Figure 3:
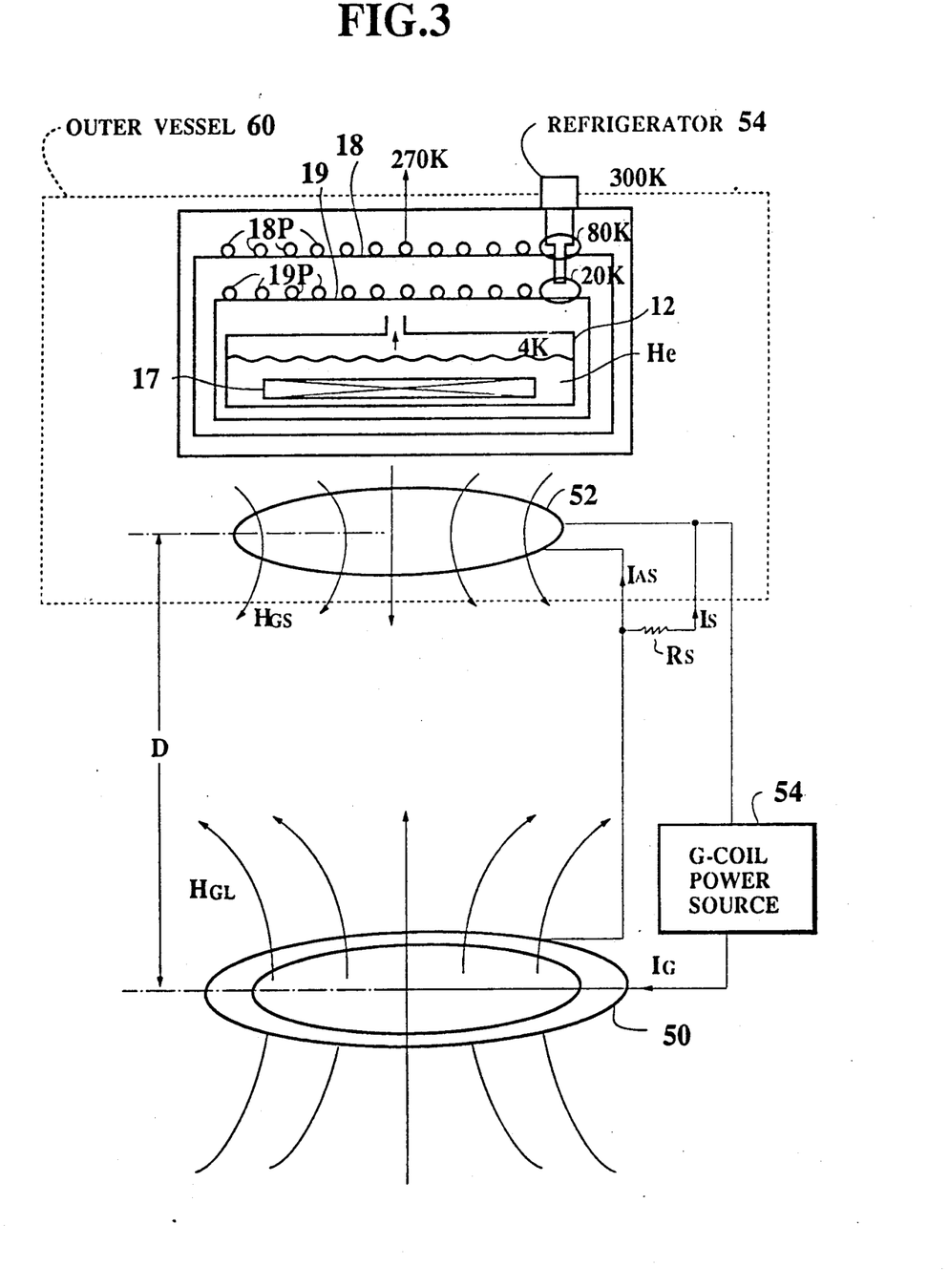
FIG. 3 pictorically illustrates a basic idea of the present invention.

Before describing various preferred embodiments, a basic idea of the present invention will now be summarized with reference to FIG. 3.

In FIG. 3, there is represented a gradient field coil assembly 50, an active shield gradient coil assembly 52, and a coil energizing power supply 54, which are employed in an MR imaging system according to the present invention.

First, the gradient coil assembly 50 is connected series with the active shield gradient coil assembly 52 via the common gradient coil power source 54. Further, a shunt resistor "$R_S$" may be connected parallel to this active shield gradient coil assembly 52 so as to shunt the coil energizing current "$I_G$", if required. Thus, a current "$I_{AS}$" flows through the active shield gradient coil assembly 52, whereas another current "$I_S$" flows through the shunt resistor "$R_S$".

In accordance with the major feature of the present invention, the active shield gradient coil assembly 52 is physically positioned apart from the gradient field coil assembly 50 by a distance "D" and stored within an outer vessel 60 for maintaining the superconducting coil 15 at a very low temperature. That is, this interval "D" between the active shield gradient coil assembly 52 and the gradient field coil assembly 50 is selected to be considerably larger than that of the conventional MR imaging system shown in FIG. 2. Accordingly, this active shield gradient coil assembly 52 is positioned in close proximity to the heat shield tubes 18 and 19 used for thermally shielding the superconducting coil 15 within the outer vessel 60.

As previously described in detail, according to the present invention, since the active shield gradient coil assembly 52 is physically positioned distant from the gradient field coil assembly 50, the following particular advantages may be achieved.

First, even if only a portion of the gradient leakage field "$H_{GL}$" produced from the gradient field coil assembly 50 will reach the active shield gradient coil assembly 52 distant therefrom, a field strength of this gradient leakage field portion becomes rather small. As a result, a magnetic field strength of the active shield field "$H_{GS}$" used for magnetically canceling this small field strength of the gradient leakage field "$H_{GL}$" similarly becomes small.

Moreover, even if a part of the gradient leakage field "$H_{GL}$" which could not be magnetically canceled by this active shield field "$H_{GS}$" reaches the heat shield tubes 18 and 19 and thus causes eddy current heat dissipation therein, only a very small temperature increase will be produced in these heat shield tubes 18 and 19. This may suppress a total amount of vapored liquid helium stored in a liquid helium tub 12, as compared with the above-described conventional MR imaging apparatus shown in FIG. 2.

There is another advantage. As apparent from FIG. 3, the energizing current "$I_{AS}$" for the active field coil assembly 52 to sufficiently and magnetically cancel the gradient leakage field "$H_{GL}$" intersecting this active shield gradient coil assembly 52, is rather small, as compared with in the conventional MR imaging apparatus shown in FIG. 2. As a consequence, since the gradient leakage field "$H_{GL}$" actually intersecting this active shield gradient coil assembly 52 may be sufficiently canceled, an eddy current loss caused by the uncanceled gradient leakage field becomes very small, as compared with the conventional MR imaging apparatus.

A relationship among these coil energizing currents is as follows:

$$I_G = I_{AS} + I_S, \text{ where } I_{AS} << I_S.$$

In FIG. 3, pipes "18P" and "19P" for circulating liquid helium are fixed on the heat shield tubes 18 and 19 respectively for maintaining the superconducting coil 17 at very low temperatures. These heat shield tubes 18, 19 and pipes 18P, 19P are mechanically coupled to the refrigerator 54 in such a manner that the temperature of the first heat shield tube 18 is maintained at approximately 80K, whereas the second heat shield tube 19 is maintained at approximately 20K.

In summary, the active shield gradient coil assembly as disclosed in, for instance, U.S. Pat. No. 4,733,189, is separated far from the gradient field coil assembly and positioned in close approximity to the heat shield tubes for maintaining the superconducting coil at very low temperatures.

More specifically, this active shield gradient coil assembly 52 may be positioned in close approximity to one heat shield tube 18 (generally, maintained at 80K) and may be cooled by the existing refrigerator 54 for also cooling the superconducting coil 17, which will cause another particular advantage.

ENTIRE CONSTRUCTION OF FIRST MR IMAGING APPARATUS

Figure 4:
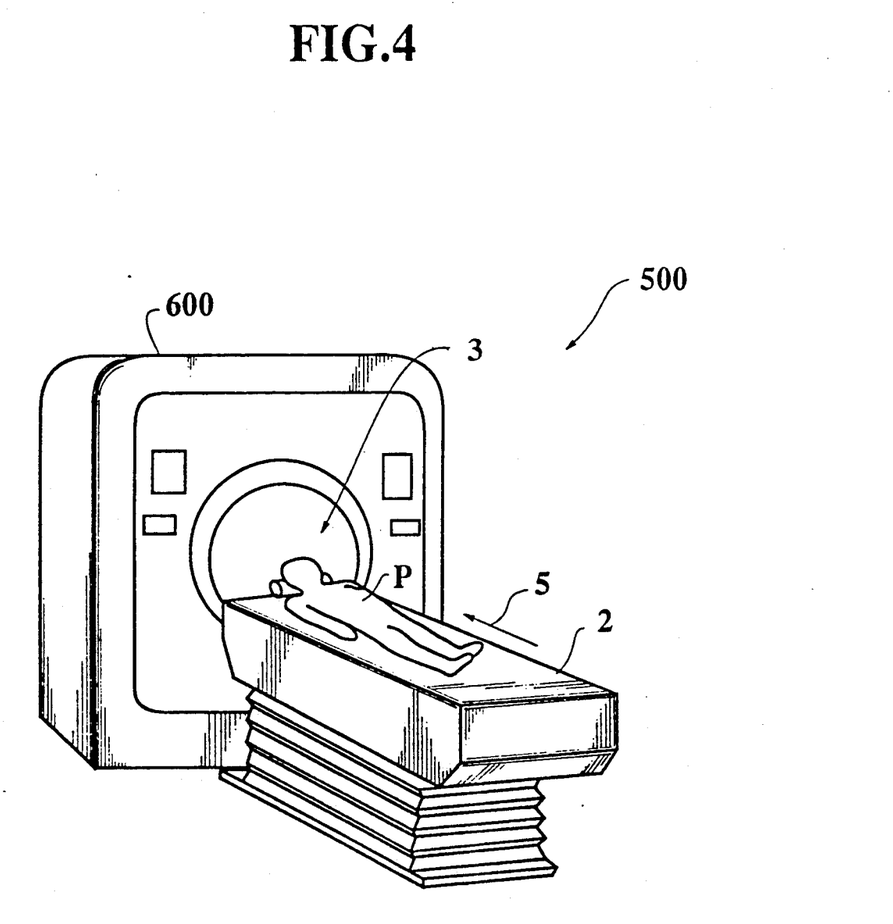
FIG. 4 schematically represents a scanner unit 500 employed in an MR imaging apparatus 1000 according to a first preferred embodiment of the present invention.
Figure 5:
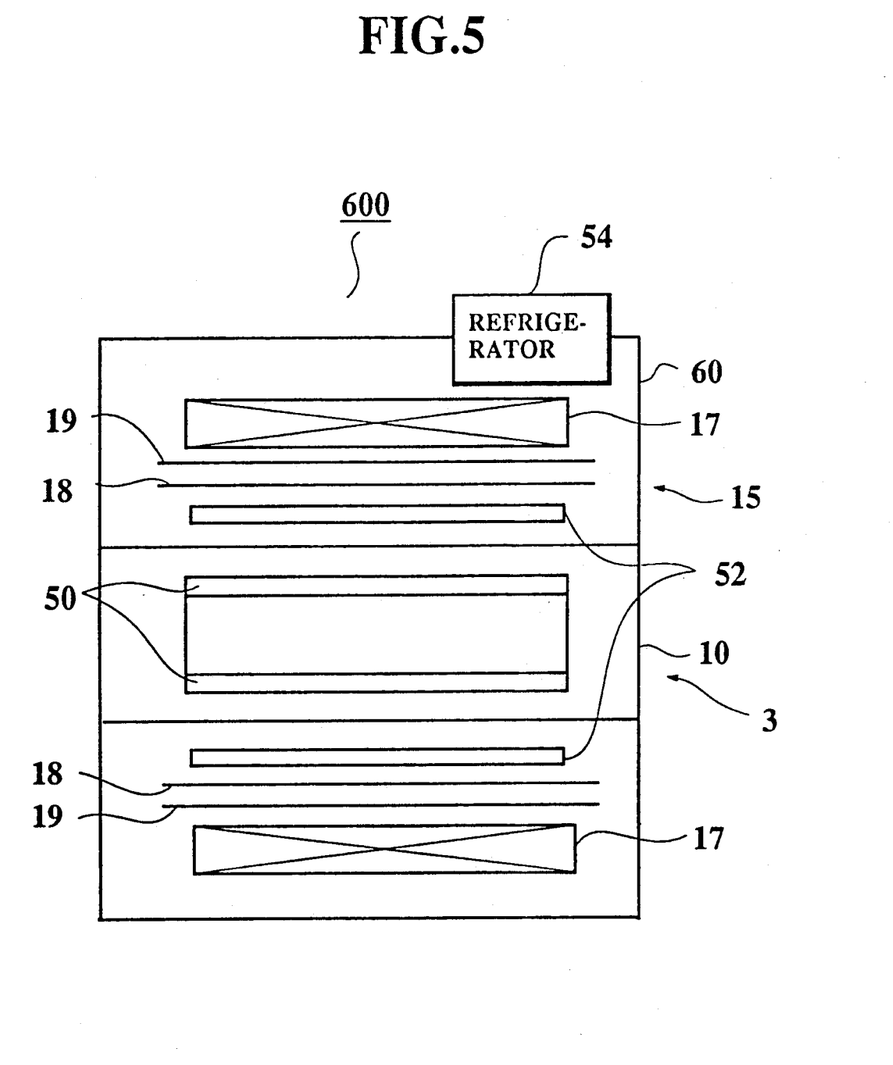
FIG. 5 schematically represents a gantry unit 600 employed in the first MR imaging apparatus 1000.

Referring now to FIGS. 4 and 5, an entire construction of an MR imaging apparatus 1000 according to a first preferred embodiment of the present invention will be described.

FIG. 4 schematically illustrates a scanner unit 500 employed in the MR imaging apparatus 1000, and FIG. 5 schematically illustrates an arrangement of a gantry unit 600 employed therein.

As represented in FIG. 4, a scanner unit 500 of the MR (magnetic resonance) imaging apparatus 1000 according to the first preferred embodiment of the present invention, is mainly constructed of a couch 2 for mounting thereon an object "P" under medical examination such as a patient and a gantry 4 having an imaging hole 3 at a center position thereof. During the MR imaging operation, the couch 2 is translated along a direction of an arrow 5 so as to insert the object "P" into the imaging hole 3.

On the other hand, as shown in FIG. 5, there are provided around a peripheral portion within the gantry 4: a superconducting magnet 15 for uniformly producing a static magnetic field in the imaging hole 3; and also a gradient field coil 50 for producing a gradient magnetic field to be superimposed with this static magnetic field. The superconducting magnet 15 is so constructed that a superconducting coil 17 is installed in the liquid helium tub 12 (see FIG. 3) maintained at a very low temperature of about 4K, a first heat shield tube 18 for thermally shielding this superconducting coil 17, which is maintained at a low temperature of approximately 20K, and a second heat shield tube 19 for thermally shielding the superconducting coil 17 via the first heat shield tube 18, which is maintained at a low temperature of about 50 to 80K. These superconducting coil 17, first and second heat shield tubes 18 and 19 are stored within an outer vessel 60, whose sectional view is substantially toroidal. This toroidal outer vessel 60 is made of reinforced plastics such as FRP (Fiber Reinforced Plastics). An interior of the outer vessel 60 is vacuumed and kept at a certain low pressure in order to shield externally transferred heat.

As the major feature of the present invention, a active shield gradient coil assembly 52 is stored within the outer vessel 60 and, precisely speaking, is positioned in close approximity to the first heat shield tube 18 and interposed between the imaging hole and the first heat shield tube 18 within the outer vessel 60. As previously explained, the function of this active shield gradient coil assembly 52 is to magnetically cancel the gradient leakage field produced from the gradient field coil assembly 50 by flowing an energizing current through the active shield gradient coil assembly 52, which is opposite to the energizing current flowing through the gradient field coil assembly 52. As a result, since the gradient leakage field may be substantially and magnetically canceled by the gradient active shield field of this active shield gradient coil assembly 52 before this leakage field reaches the first and second heat shield tubes 18 and 19, substantially no eddy current flows through the first and second heat shield tubes 18 and 19.

It should be noted that the active shield gradient coil 52 is electrically insulated from the first and second heat shield tubes 18 and 19, and thermally connected thereto.

OPERATION OF FIRST MR IMAGING APPARATUS

Figure 6:
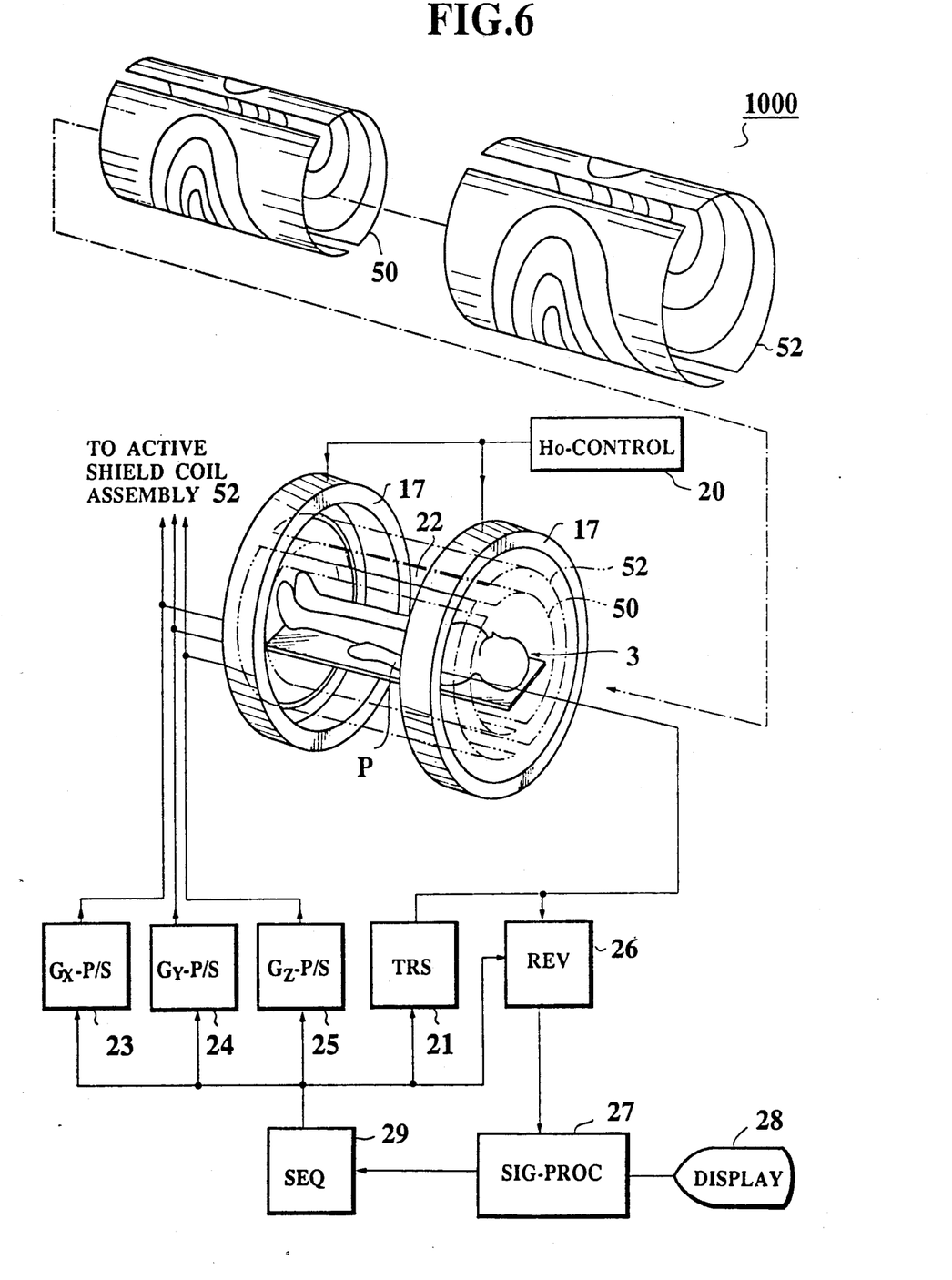
FIG. 6 schematically illustrates an overall system of the first MR imaging apparatus 1000; and, FIG. 7 pictorically illustrates an arrangement of the active shield gradient coil assembly employed in another MR imaging apparatus according to a second preferred embodiment.

FIG. 6 schematically shows an overall system of the first MR imaging apparatus 1000, from which a positional relationship between the gradient field coil assembly 50 and active shield gradient coil assembly 52 may be pictorically understood. For the sake of simplicity, the heat shield tubes 18, 19 and refrigerator 54 are omitted from FIG. 6.

An overall imaging operation of the first MR imaging apparatus 1000 will now be described.

In the first MR imaging system 1000 shown in FIG. 6, the static magnetic field "$H_O$" is uniformly applied from the superconducting coil 17 to the object "P" under medical examination inserted into the imaging hole 3 mounted on the couch 2 in response to a control signal supplied from a static magnetic field controller 20. Further, in response to an RF (radio frequency) current furnished from a transmitter 21, an RF excitation field is applied from an RF coil 22 and also each of the gradient magnetic fields generated from the gradient field coil assembly 52 is superimposed with the static magnetic field. This gradient field coil assembly 50 is energized by each of gradient field power sources 23, 24 and 25 for X-axis, Y-axis and Z-axis. At the same time, the above-described gradient active shield field is generated from the active shield gradient coil assembly 52 so as to magnetically cancel the gradient leakage field leaked from the gradient magnetic field.

Under the above-described conditions, an MR signal is produced from a specific portion of the object "P" and then is received by the RF coil 22. Thereafter, this MR signal is supplied via a receiver 26 to a signal processor 27. In this signal processor 27, the MR signal is image-processed such as the Fourier transform process so as to reconstruct tomographic images of the object "P". Thus, tomographic image data representative of the reconstructed tomographic images are supplied to a display unit 28, whereby the tomographic images of preselected slices of the object "P" under medical examination may be monitored on the display unit 28. A sequencer 29 is employed to sequentially drive the respective gradient field power sources 23, 24, 25, transmitter 21 and receiver 22.

As previously described, in accordance with the first MR imaging apparatus 1000, the active shield gradient coil assembly 52 is positioned close to the first heat shield tube 18 within the outer vessel 60 (see FIG. 5), so that the interval "D" (see FIG. 3) between the gradient field coil assembly 50 and active shield gradient coil assembly 52 is considerably greater than that of the conventional MR imaging apparatus shown in FIG. 2. As a consequence, since the field strength of the leakage field reaching the active shield gradient coil assembly 52 is relatively small, as compared with that of the conventional MR imaging apparatus, this leakage field may be sufficiently canceled by the relatively small field strength of the active shield field before this leakage field reaches the first and second heat shield tubes 18 and 19. In other words, magnetic canceling loss occurring when the desirable gradient field is produced becomes small.

As a result, the eddy current occurring in the first and second heat shield tubes 18 and 19 may be sufficiently suppressed by flowing only small coil energizing current through the active shield gradient coil assembly 52. Moreover, a power capacity of an active shield gradient coil power supply (i.e., the gradient field power sources 23, 24 and 25) may be reduced, as compared with that of the conventional MR imaging apparatus.

CONSTRUCTION OF SECOND MR IMAGING APPARATUS

Figure 7:
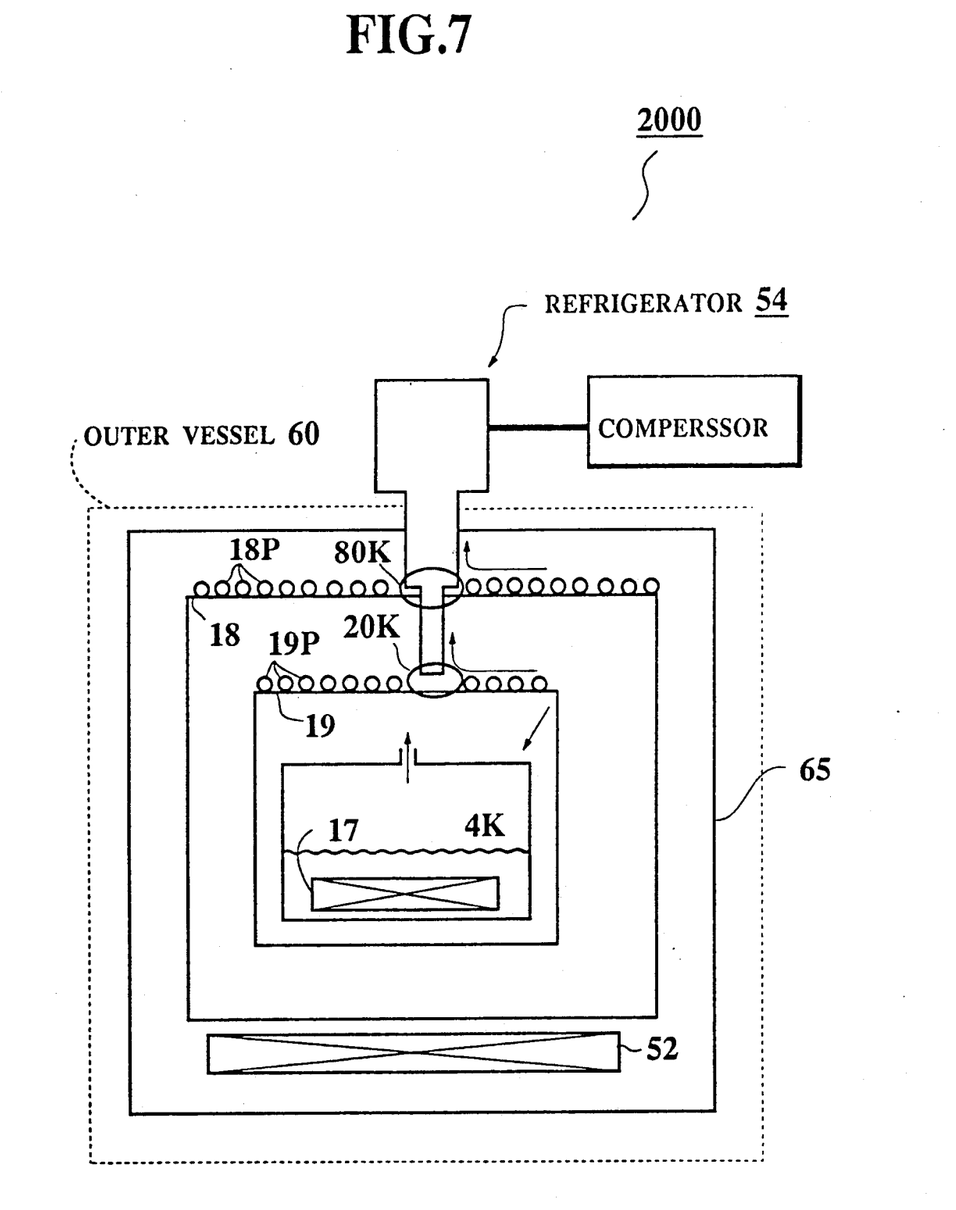

FIG. 7 schematically illustrates a major part of an MR imaging apparatus 2000 according to a second preferred embodiment of the present invention.

As apparent from FIG. 7, a major feature of the second MR imaging apparatus 2000 is such that the active shield gradient coil assembly 52 is stored within a third heat shield tube 65 in the outer vessel 60, and is cooled by the refrigerator 54 which is commonly used to cool the superconducting magnet 57.

Since the active shield gradient coil assembly 52 is commonly cooled by one refrigerator 54, no separate refrigerator used only for cooling this coil assembly 52 is required. Consequently, the entire construction of the second MR imaging apparatus 2000 may be made simple and the manufacturing cost of which may be reduced.

As previously described in detail, the present invention can have the following particular advantages.

For instance, since the relative position between the gradient field coil 50 and active shield gradient coil 52 may be varied in the first and second MR imaging apparatuses 1000 and 2000, assembling precision may be readily adjusted. In the above-described conventional MR imaging apparatus having the bore with a small diameter without any active shield gradient coil assembly, when the active shield gradient coil assembly is employed within the outer vessel 106 for the superconducting magnet 104, this conventional MR imaging apparatus may be simply modified as an MR imaging apparatus of the present invention without changing the small bore diameter.

Furthermore, the number of heat shield tubes for a refrigerator may be increased rather than 2, which may expect more higher cooling capabilities, so that more stable static magnetic field may be produced and thus the S/N ratio of the tomographic image may be further increased.

While the present invention has been described in detail, since the active shield gradient coil assembly is provided within the outer vessel of the superconducting magnet, and therefore the interval between the gradient field coil assembly and active shield gradient coil assembly becomes large, the field strength of the leakage field actually reaching the active shield gradient coil assembly is weakened and only the small current for energizing the active shield gradient coil assembly can sufficiently cancel this leakage field.

Since the refrigerator for cooling the superconducting magnet may be commonly used also to cool the active shield gradient coil assembly, no additional refrigerator for cooling only this active shield gradient coil is longer required.

What is claimed is:

1. A magnetic resonance imaging apparatus comprising:
   an MR (magnetic resonance) imaging unit having an imaging hole at a substantially central portion thereof, into which an object under medical examination is inserted;
   a superconducting coil unit stored within an outer vessel which is positioned around the imaging hole, and including superconducting coil means for uniformly producing a static magnetic field to be applied to the object, and at least one heat shield member for thermally shielding the superconducting coil means enclosed therein;
   gradient field coil means provided between the outer vessel and imaging hole, for producing a gradient magnetic field so as to be superimposed with the static magnetic field, and,
   active shield gradient coil means for producing a gradient shield field, and disposed within the outer vessel in such a manner that the active shield gradient coil means is thermally coupled to the heat shield member and also magnetically coupled with a leakage field leaked from the gradient magnetic field of the gradient field coil means, whereby the leakage field is magnetically canceled by the gradient shield field and substantially no eddy current is produced in the heat shield member.

2. A magnetic resonance imaging apparatus as claimed in claim 1, wherein said active shield gradient coil means is positioned in close approximity to the heat shield member within the outer vessel.

3. A magnetic resonance imaging apparatus as claimed in claim 1, further comprising:
a second heat shield member for enclosing said superconducting coil assembly, within the heat shield member.

4. A magnetic resonance imaging apparatus as claimed in claim 3, further comprising:
a refrigerator for cooling both of said heat shield members at predetermined lower temperatures than an ambient temperature of the outer vessel.

5. A magnetic resonance imaging apparatus as claimed in claim 1, further comprising:
a second heat shield member for enclosing said heat shield member;
a third heat shield member for storing both of said second heat shield member and said active shield gradient coil means within the outer vessel; and,
a refrigerator for cooling at least both of said first heat shield member and said active shield gradient coil means at preselected lower temperatures than an ambient temperature of the outer vessel.

6. A magnetic resonance imaging apparatus as claimed in claim 1, wherein said heat shield member is a heat shield tube.

* * * * *